(12) United States Patent
Li et al.

(10) Patent No.: US 12,105,986 B2
(45) Date of Patent: Oct. 1, 2024

(54) DEVICES, CHIPS, AND ELECTRONIC EQUIPMENT FOR COMPUTING-IN-MEMORY

(71) Applicant: TSINGHUA UNIVERSITY, Beijing (CN)

(72) Inventors: Xueqing Li, Beijing (CN); Wenjun Tang, Beijing (CN); Jialong Liu, Beijing (CN); Chen Jiang, Beijing (CN); Yongpan Liu, Beijing (CN); Huazhong Yang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 211 days.

(21) Appl. No.: 17/740,183

(22) Filed: May 9, 2022

(65) Prior Publication Data

US 2023/0132411 A1 May 4, 2023

(30) Foreign Application Priority Data

Nov. 4, 2021 (CN) .......................... 202111300870.7
Dec. 31, 2021 (CN) .......................... 202111665757.9

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
CPC .... G06F 3/0655; G06F 3/0604; G06F 3/0679; G11C 11/405; G11C 7/1006; G11C 11/54
See application file for complete search history.

(56) References Cited

U.S. PATENT DOCUMENTS

| | | | | |
|---|---|---|---|---|
| 11,176,991 B1* | 11/2021 | Shaik | ................... | G11C 11/4096 |
| 2021/0005230 A1* | 1/2021 | Wang | ..................... | G11C 7/106 |
| 2021/0241820 A1* | 8/2021 | Biswas | ............... | G11C 11/4097 |
| 2021/0343343 A1* | 11/2021 | Teague | ................... | G11C 16/26 |
| 2022/0351032 A1* | 11/2022 | Chou | ................... | G06N 3/0464 |
| 2022/0398438 A1* | 12/2022 | Zhang | ................... | G11C 16/24 |

(Continued)

*Primary Examiner* — Francisco A Grullon
(74) *Attorney, Agent, or Firm* — MARSHALL, GERSTEIN & BORUN LLP

(57) ABSTRACT

A computing-in-memory array, chip and electronic device includes a computing-in-memory array including at least one computing-in-memory cell having a first switch, a second switch, a third switch, a fourth switch, a coupling capacitor, a first bitline, a second bitline, a third bitline, a first wordline, a second wordline and a third wordline; a control module connected to the computing-in-memory array, which controls the voltages of each wordline and bitline to read and write data through the computing-in-memory array, or to perform computing-in-memory operations. By arranging the first switch, the second switch, the third switch, and the fourth switch in a differential form, and determining the stored value by the difference of the voltage between the two ports of the second switch and the third switch, the present embodiment of the disclosure can implement computing-in-memory operations with high accuracy, low circuit complexity, high reliability, and high energy efficiency. For memory function, the computing-in-memory device has a long data retention time and low data refresh overhead.

8 Claims, 11 Drawing Sheets

(56) References Cited

U.S. PATENT DOCUMENTS

2022/0414443 A1* 12/2022 Li .......................... H03M 1/12
2022/0414444 A1* 12/2022 Li .......................... G06N 3/045
2022/0414454 A1* 12/2022 Li .......................... G06N 3/063

* cited by examiner

|          | Write  | Read     | Analog MAC | Binary MAC | Standby |
|----------|--------|----------|------------|------------|---------|
| WL       | 4V     | 0V       | 0V         | 0V         | 0V      |
| BL/BLB   | 0V/3V  | 0V       | 0V         | 0V         | 0V      |
| IL       | 0V     | 1V       | 0V~1V      | 0V/1V      | 0V      |
| ILB      | 0V     | 0V       | 0V         | 1V/0V      | 0V      |
| RL       | 0V     | Floating | Floating   | Floating   | 0V      |

| Power Decomposition (Normalization with standby power of the present disclosure) | High activity (100 images/s) | | | | Low activity (1 image/s) | | | |
|---|---|---|---|---|---|---|---|---|
| | a-IGZO eDRAM | | CMOS eDRAM | CMOS SRAM | a-IGZO eDRAM | | CMOS eDRAM | CMOS SRAM |
| | q-CiM | i-CiM | q-CiM | q-CiM | q-CiM | i-CiM | q-CiM | q-CiM |
| CiM cell array power | 2.26 | 1765 | 1.99 | 1.99 | 2.26 | 17.65 | 1.99 | 1.99 |
| Sensing interface power | 3.72 | 372 | 3.72 | 3.72 | 3.72 | 3.72 | 3.72 | 3.72 |
| Quiescent Power | 1 | 81 | 2353 | 432 | 1 | 11.57 | 2353 | 432 |
| Quiescent Power/Compute Power | 1.67E-3 | 3.79E-2 | 4.12 | 0.76 | 0.17 | 0.54 | 412 | 75.81 |
| Total Power | 599 | 2218 | 2924 | 1003 | 6.98 | 32.94 | 2359 | 438 |

FIG. 17

| | This patent | IEDM 2020 [1] | JJAP 2020 [2] | ISSCC 2021 [3] | ISSCC 2021 [4] |
|---|---|---|---|---|---|
| Technology | 45nm a-IGZO | 22nm a-IGZO | 350nm IGZO + 110 nm Si | 65nm Si | 16nm Si |
| CiM scheme | eDRAM q-CiM | eDRAM i-CiM | eDRAM i-CiM | eDRAM i-CiM | SRAM q-CiM |
| Measured array size | Single cell | No chip | 9×16 | 64×32 | 1152×256 |
| Weights storage | Binary | Binary | Analog | Analog | Binary |
| Precision (Weights /Inputs/Outputs) | 4/Analog/8 | Ternary/8/16 | Analog /Analog/4 | 4/4/5 | 1-8/1-8/8 |
| Energy efficiency (TOPS/W) | 2092[a], 795[b] | 1800[a], 15[b] | 5[a] | 102.2[bd] | 121[bc] |
| MAC computing density (TOPS/mm$^2$) | 18.6[a] | 37[a], 4[b] | 1.02[a] | 8.58[bd] | 2.67[bc] |
| Retention time | High | Medium | Medium | Short | - |
| Robustness | High | Medium | Medium | Medium | High |

FIG. 18

DEVICES, CHIPS, AND ELECTRONIC EQUIPMENT FOR COMPUTING-IN-MEMORY

CROSS-REFERENCE TO RELATED APPLICATIONS

The present application claims priority to Chinese Application No. 202111300870.7, filed Nov. 4, 2021 and Chinese Application No. 202111665757.9, filed Dec. 31, 2021. The priority application, CN 202111300870.7 and CN 202111665757.9, are hereby incorporated by reference.

FIELD

The present invention relates to the integrated circuit technique, and more particularly to a kind of computing-in-memory devices, chips, and electronic equipment.

BACKGROUND

Conventional Von Neumann architecture is facing the bottleneck of system performance about data transmission between memory and processing units, especially in data-intensive applications such as neural networks (NNs). Computing-in-memory (CiM) is an emerging solution for solving this "memory wall" issue, which processes data directly in the memory. The data processing is usually implemented in the analog domain, achieving high energy efficiency and high parallelism.

Related techniques of CiM include analog computing schemes in the current domain or charge domain based on different technologies and memory hierarchies. For TFT-based current-domain CiM that uses a dynamic precharging/discharging scheme (refer to P. Houshmand et al., "Opportunities and Limitations of Emerging Analog in-Memory Compute DNN Architectures," 2020 IEEE International Electron Devices Meeting (IEDM), 2020, pp. 29.1.1-29.1.4.), better energy efficiency can be achieved than CiM with DC current sensing, but the energy efficiency is still slightly lower than charge-domain CiM under the same capacitance for a CiM cell. And the timing requirements and complexity are relatively high because the input is dynamically given by different pulse widths. In addition, the output characteristics of the transistor effect the computing results, which leads to lower robustness for TFTs with large variation and instability. Another related technology exploits the transistor characteristics in the saturation region (refer to Yoshiyuki Kurokawa et al., "CAAC-IGZO FET/Si-FET hybrid structured analog multiplier and vector-by-matrix multiplier for neural network", Japanese Journal of Applied Physics, vol. 59, no. SG, pp. SGGB03, 2020), which introduces DC current that can have low energy efficiency. Besides, the CiM cell, the peripheral circuit, and the timing control are all complicated, and the computing result depends on the characteristics of the transistor, all of which lower the robustness of the design. For CMOS-based current-domain CiM (refer to Z. Chen, X. Chen and J. Gu, "15.3 A 65 nm 3T Dynamic Analog RAM-Based Computing-in-Memory Macro and CNN Accelerator with Retention Enhancement, Adaptive Analog Sparsity and 44 TOPS/W System Energy Efficiency," 2021 IEEE International Solid-State Circuits Conference (ISSCC), 2021, pp. 240-242), a similar discharge method as IEDM2020 is exploited but the input is given by analog voltages. The computing result also depends on the characteristics of the transistor. As each cell stores multiple bits, the energy efficiency equivalented to 1-bit is improved. For CMOS-based charge-domain CiM (refer to H. Jia et al., "15.1 A Programmable Neural-Network Inference Accelerator Based on Scalable In-Memory Computing," 2021 IEEE International Solid-State Circuits Conference (ISSCC), 2021, pp. 236-238), high parallelism, high energy efficiency, and reduced dependence on transistor characteristics can be achieved. But the static power consumption due to leakage current of SRAM is much higher than that in IGZO TFT-based eDRAM implementations, especially in advanced technology nodes.

As mentioned above, CiM implementations in the related techniques have challenges in terms of complexity, computing overhead, accuracy, and reliability. Particularly for TFT-based CiM, the robustness to device characteristics is an important consideration in the design. Different from the related CiM techniques based on SRAM or in current domain, the present disclosure provides a charge-domain CiM technique based on eDRAM, with enhanced retention time and high-accurate energy-efficient robustness CiM operations.

SUMMARY

The present disclosure aims to provide a CiM device, comprising:
  a CiM array comprising at least one CiM cell comprising the first switch, the second switch, the third switch, the fourth switch, the coupling capacitor, the first bitline, the second bitline, the third bitline, the first wordline, the second wordline and the third wordline, where the first end, the second end and the control end of the first switch are connected to the first bitline, the control end of the second switch and the first wordline respectively, the first end of the second switch is connected to the first end of the third switch and to the first end of the coupling capacitor respectively, the second end of the second switch is connected to the second wordline, the control end and the second end of the third switch are connected to the first end of the fourth switch and the third wordline respectively, the control end and the second end of the fourth switch are connected to the first wordline and to the second bitline respectively, the second end of the coupling capacitor is connected to the third bitline;
  a control module, connected to said CiM array, controlling the voltage state of each wordline, each bitline, which reads and writes the data through said CiM array, or performs CiM operations.

In an embodiment of the present disclosure, the difference between the voltage between the control end and the second end of said second switch and the voltage between the control end and the second end of said third switch correlates with the stored value of said CiM cell.

In an embodiment of the present disclosure, said control module controls the voltage of the first wordline to turn off the first switch and the fourth switch of said CiM cell, so that said CiM cell is in the standby state.

In an embodiment of the present disclosure, said control module is used to:
  control the second wordline and the third wordline to be the first preset voltage and control the voltage of the first bitline and the second bitline to be a differential voltage that corresponds to the state of the data to be written to said CiM cell;
  control the voltage of the first wordline such that said first switch and said fourth switch are turned on to store said data;

control the voltage of the first wordline such that said first switch and said fourth switch are both off.

In an embodiment of the present disclosure, the CiM operations comprise multiplication calculation between the input analog data and the stored data, where the stored data is in said CiM cell. Said control module is used to:
control the voltage of the second wordline as the first analog voltage that corresponds to said input analog data;
control the third wordline as the second preset voltage;
determine the computing result of the multiplication between the input analog data and the stored data by the voltage at the first end of said coupling capacitor.

In an embodiment of the present disclosure, the CiM operations comprise the XNOR calculation between the input digital data and the stored data, where the stored data is in said CiM cell. Said control module is used to:
control the voltage of the second wordline and the third wordline as a differential voltage that corresponds to said input digital data;
determine the computing result of XNOR between the input digital data and the stored data by the voltage at the first end of said coupling capacitor.

In an embodiment of the present disclosure, said CiM array comprises M rows and N columns, where M and N are integers greater than 0. The first wordline, the second wordline, and the third wordline of the CiM cells in the same row of said CiM array are connected respectively, and/or, the first bitline, the second bitline, and the third bitline of the CiM cells in the same column of said CiM array are connected respectively.

In an embodiment of the present disclosure, said control module is used to:
control the second wordline and the third wordline of the target row to be the first preset voltage, and control the voltages of the first bitline and the second bitline of each CiM cell in the target row to be differential voltages corresponding to the data being written to each CiM cell in said target row;
control the voltage of the first wordline of said target row such that said first switches and said fourth switches are turned on to store the data being written to said target row.

In an embodiment of the present disclosure, said control module is used to:
ground each third bitline for the first duration and then control each third bitline to be floating;
control the second wordline of the target row to be the third preset voltage, and control the third wordline of the target row, the second wordlines of the other rows, and the third wordlines of the other rows to be the second preset voltage;
determine the stored data of the corresponding CiM cells by the voltages of each third bitline, which corresponds to the data read results of the target row.

In an embodiment of the present disclosure, said CiM operations comprise the matrix-vector multiplication between the input analog one-dimensional vector and the stored two-dimensional matrix, where the stored matrix is in said CiM array. Said control module is used to:
ground each third bitline for the first duration and then control each third bitline to be floating;
control the voltages of each second wordline to be the analog voltages corresponding to the analog data input to each row;
control the third wordlines to be the second preset voltage;
determine the matrix-vector multiplication result by the voltages of each third bitline.

In an embodiment of the present disclosure, said device determines the matrix-vector multiplication result by the voltage of each third bitline, comprising:
combining the states corresponding to the voltages of each third bitline to obtain said matrix-vector multiplication result.

In an embodiment of the present disclosure, said CiM operations comprise matrix-vector multiplication between the input digital one-dimensional vector and the stored two-dimensional matrix, where the stored matrix is in said CiM array. Said control module is used to:
ground each third bitline for the first duration and then control each third bitline to be floating;
control the voltages of the second wordlines and the third wordlines of each row to be differential voltages corresponding to the digital data input to each row;
determine the matrix-vector multiplication result by the voltages of each third bitline.

In an embodiment of the present disclosure, the overlapping capacitor of said second switch and said third switch is greater than the overlapping capacitor of said first switch and said fourth switch.

In an embodiment of the present disclosure, said chip comprises said CiM device.

In an embodiment of the present disclosure, said electronic device comprises said chip.

BRIEF DESCRIPTION OF THE DRAWINGS

The above and/or additional aspects and advantages of the present disclosure will become apparent and more readily appreciated from the following descriptions made for embodiments with reference to the accompanying drawings, in which:

FIG. 17 is a comparison diagram of the power consumption of the CiM array based on an embodiment of the present disclosure compared with other CiM solutions evaluated in the image classification application at high event activity and at low event activity.

FIG. 18 is a comparison diagram of the CiM device based on an embodiment of the present disclosure with other CiM solutions in the related arts.

DETAILED DESCRIPTION

Figure 1:
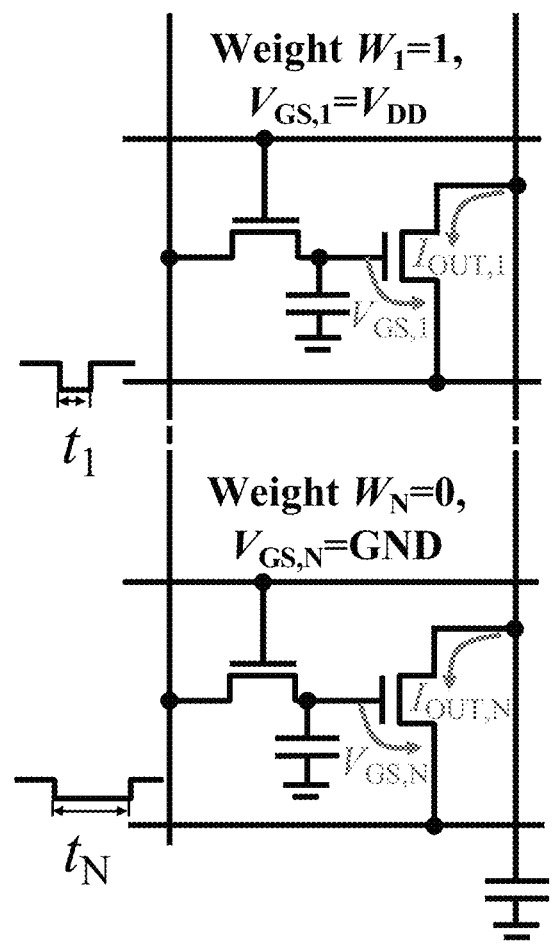
FIG. 1 is a schematic diagram illustrating an eDRAM-based current-domain CiM.

Description will be shown in detail below according to embodiments of the present disclosure. Examples of embodiments are illustrated in the accompanying drawings, in which, the same or similar numbers represent the same or similar elements or elements with the same or similar functions. Although various aspects of the embodiments are shown in the drawings, it is not necessary to draw the drawings to scale unless otherwise noted.

In the description of the present disclosure, it should be understood that the orientation or positional relationship indicated by the terms: "length", "width", "up", "down", "front", "back", "left", "right", "vertical", "horizontal", "top", "bottom", "inside", "outside" is based on the orientation or positional relationship shown in the drawings. It is only for the convenience of describing the present disclosure and simplifying the description, rather than indicating or implying that the device or element must have a specific orientation, be constructed and operate in a specific orientation, which cannot be understood as a limitation of the present disclosure.

In addition, the terms "first" and "second" are used for descriptive purposes only and cannot be understood as indicating or implying relative importance or implicitly indicating the number of technical features indicated. Thus, the features defined with "first" and "second" can explicitly or implicitly include one or more of the features. In the description of the present disclosure, "multiple" means two or more, unless otherwise specifically indicated.

In the present disclosure, unless otherwise specified and defined, the terms "installation", "connection", "connection" and "fixation" shall be understood in a broad sense. For example, they can be fixed connection, detachable connection or integrated connection; It can be mechanical connection or electrical connection; It can be directly connected, or indirectly connected through intermediate media, or the internal connection of two components or the interaction between two components. For those of ordinary skill in the art, the specific meaning of the above terms in the present disclosure can be understood according to the specific situation.

Here, the special word "exemplary" means "used as an example, an embodiment, or an illustration". Any embodiment described herein as "exemplary" need not be interpreted as superior or better than other embodiments.

In addition, in order to better illustrate the present disclosure, numerous specific details are given in the following specific embodiments. It should be understood by those skilled in the art that the present disclosure can also be implemented without certain specific details. In some examples, the methods, means, elements and circuits familiar to those skilled in the art are not described in detail, so as to highlight the subject matter of the present disclosure.

Corresponding to the description of the background techniques, the CiM solutions in related techniques suffer from high complexity, high computing overhead, low accuracy, and poor reliability. There have been various CiM works based on different memories in recent years, including embedded Dynamic Random Access Memory (eDRAM), Static Random Access Memory (SRAM), Nonvolatile Memory (NVM), and so on. For processes without NVM devices integrated, eDRAM-based CiM solutions have higher storage and computing density than SRAM-based ones, which is advantageous for NN applications that require large-scale storage and high-throughput computing. In particular, oxide TFT especially IGZO TFT is a candidate for implementing eDRAM-based CiM due to its ultra-low leakage characteristic. The IGZO-TFT-based eDRAM CiM structure in current domain is shown in FIG. 1. The structure of the eDRAM CiM cell consists of two transistors (T) and one capacitor (C), which is called a 2T1C gain cell. The current-domain TFT-based eDRAM CiM shown in FIG. 1 faces two main challenges. First, the computing accuracy degrades seriously due to charge leakage, which requires a much higher frequency of data refresh than that of conventional eDRAM without CiM functions. Second, the sensitivity to process, voltage, and temperature (PVT) variation, as well as the possible overflow of computing results, both make it difficult to scale to a larger CiM array.

The embodiment of the present disclosure proposes a CiM array, which comprises at least one CiM cell comprising the first switch, the second switch, the third switch, the fourth switch, the coupling capacitor, the first bitline, the second bitline, the third bitline, the first wordline, the second wordline and the third wordline, where the first end, the second end and the control end of the first switch are connected to the first bitline, the control end of the second switch and the first wordline respectively, the first end of the second switch is connected to the first end of the third switch and to the first end of the coupling capacitor respectively, the second end of the second switch is connected to the second wordline, the control end and the second end of the third switch are connected to the first end of the fourth switch and the third wordline respectively, the control end and the second end of the fourth switch are connected to the first wordline and to the second bitline respectively, the second end of the coupling capacitor is connected to the third bitline; a control module, connected to said CiM array, controlling the voltage state of each wordline, each bitline, which reads and writes the data through said CiM array, or performs computing operations. By arranging the first switch, the second switch, the third switch, and the fourth switch in a differential form, and determining the stored value by the difference of the voltage between the two ports of the second switch and the third switch, the present embodiment of the disclosure can implement CiM operations with high accuracy, low circuit complexity, high reliability, and high energy efficiency. For memory function, said computing-in-memory device has a long data retention time and low data refresh overhead.

The CiM device proposed by the embodiment of the present disclosure is based on the charge domain, i.e., based on the law of charge conservation, to implement the computing operation, e.g., multiply-accumulation, which consists of multiplication implemented by XNOR logic or AND logic, and accumulation implemented by charge redistribution on the bitline. The charge-domain CiM method employed in the CiM device of the present embodiment has the following advantages over the current-domain CiM and voltage-domain CiM. First, the linearity of the computing result is high because the accumulation process is based on a well-matched passive capacitor network, while the matching of transistors is more difficult thus limiting the linearity of the CiM computing in current domain. Second, the transistor is only used as a switch, therefore the computing characteristics only depend on the on-off ratio of the switch, which leads to strong robustness of the computing. Third, the result of charge-domain computing operation settles to a steady-state voltage, which releases the requirement for timing control compared to voltage-domain discharge methods. Fourth, there is no static current after the computing, so there is only dynamic power in the computing process, which leads to high energy efficiency. Fifth, due to the average effect of charge redistribution, the output result voltage value is automatically normalized to the input dynamic range, thus there is no overflow issue. The insensitivity of charge-domain CiM operation to device variation and mismatch makes it suitable for high-reliable computing circuit designs, especially with large variation processes such as TFT. Also, the embodiment of the present disclosure supports large-scale in-memory MAC operation with high energy efficiency, which makes it advanced in edge computing scenarios with low-power computing tasks. The embodiment of the present disclosure does not limit the application scenario of the CiM device.

The CiM device of the embodiment of the present disclosure may be used in an electronic device, for example, a terminal device, a server, etc., wherein the terminal device may be a user equipment (UE), a mobile device, a user terminal, a handheld device, a computing device, or an on-board device, etc. Examples of some terminals include mobile phones, tablets, laptops, PDAs, mobile internet devices (MID), wearable devices, virtual reality (VR) devices, augmented reality (AR) devices, wireless terminals in industrial control, wireless terminals in self-driving, wireless terminals in remote medical surgery, wireless terminals in smart grid, wireless terminals in transportation safety, wireless terminals in smart city, wireless terminals in smart homes, wireless terminals in the internet of vehicles, etc. The servers can be local servers, cloud servers, etc.

Figure 2:
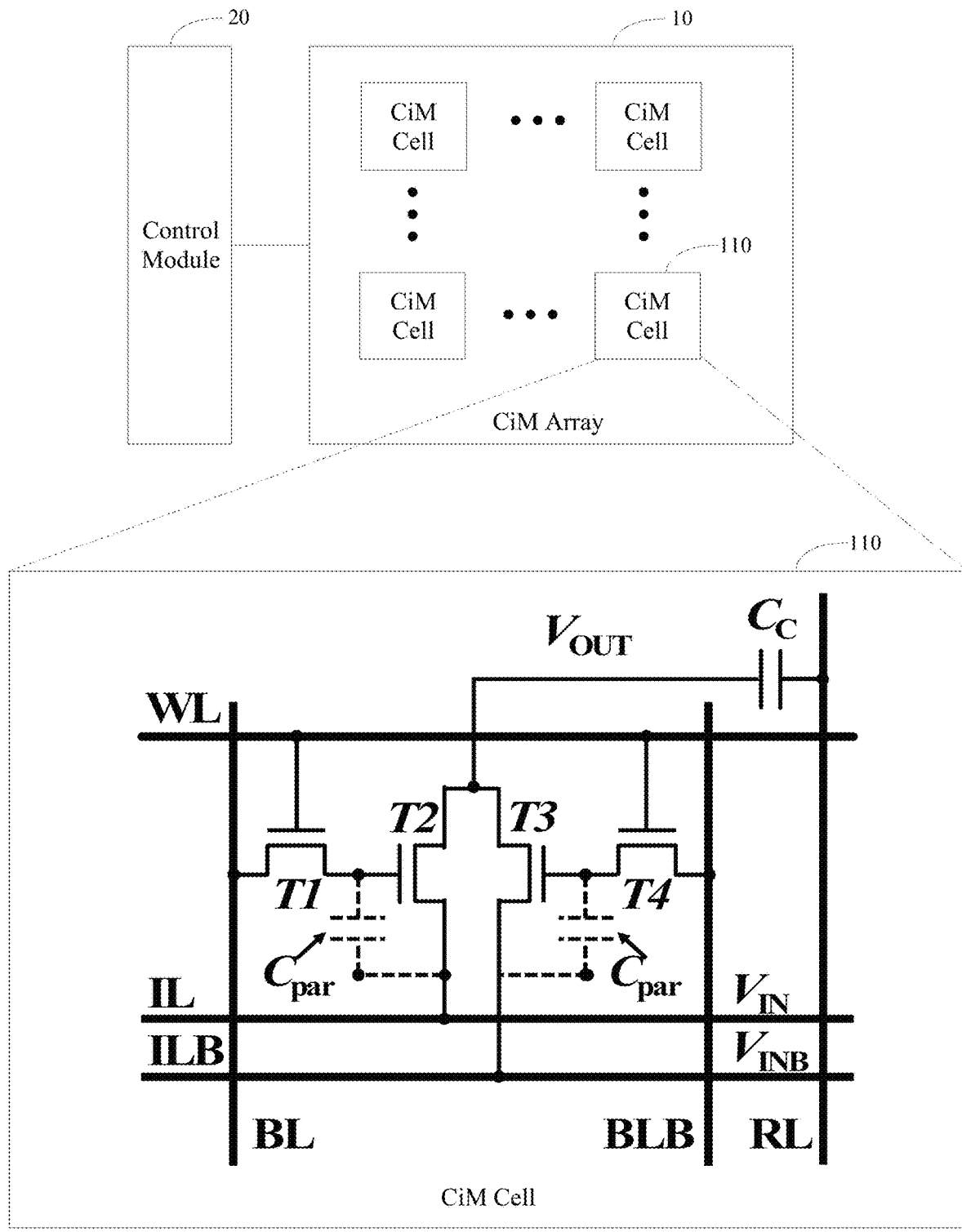
FIG. 2 is a schematic diagram illustrating a CiM device based on an embodiment of the present disclosure.

Please refer to FIG. 2, which illustrates a schematic diagram illustrating a CiM device based on an embodiment of the present disclosure.

As shown in FIG. 2, said device comprises:

A CiM array 10, which comprises at least one CiM cell 110 comprising the first switch T1, the second switch T2, the third switch T3, the fourth switch T4, the coupling capacitor $C_C$, the first bitline BL, the second bitline BLB, the third bitline RL, the first wordline WL, the second wordline IL and the third wordline ILB, where the first end, the second end and the control end of the first switch T1 are connected to the first bitline BL, the control end of the second switch T2 and the first wordline WL respectively, the first end of the second switch T2 is connected to the first end of the third switch T3 and to the first end of the coupling capacitor $C_C$ respectively, the second end of the second switch T2 is connected to the second wordline IL, the control end and the second end of the third switch T3 are connected to the first end of the fourth switch T4 and the third wordline ILB respectively, the control end and the second end of the fourth switch T4 are connected to the first wordline WL and to the second bitline BLB respectively, the second end of the coupling capacitor $C_C$ is connected to the third bitline RL;

a control module 20, connected to said CiM array 10, controlling the voltage state of each wordline, each bitline, which reads and writes the data through said CiM array 10, or performs computing operations.

The first switch T1, the second switch T2, the third switch T3, and the fourth switch T4 can be any type of switch, and this disclosed embodiment is not limited to this, exemplarily, the first switch T1, the second switch T2, the third switch T3, and the fourth switch T4 can be transistors, for example, oxide TFTs, low-temperature polycrystalline silicon (LTPS) TFTs, silicon-based field-effect transistors, etc., or two of them integrated. Exemplarily, the first switch T1, the second switch T2, the third switch T3, and the fourth switch T4 are implemented by indium-gallium-zinc oxide (IGZO) TFT processes under 45 nm.

Exemplarily, the first end and the second end of each switch can be the source and the drain of the transistor. The transistor used in the disclosure of the present embodiment has symmetry, that is, no distinction is made between the source and the drain of the transistor. Of course, in other embodiments, one can fix one end of the transistor as the source and the other as the drain according to the situations and needs.

The wordline WL of this embodiment can be connected to the control terminal of the switches. When the control module 20 controls the WL to be an active voltage, the corresponding switches are turned on (e.g., for an NMOS, high voltage is active voltage, and when the WL is high, the corresponding NMOS is turned on). The bitline BL and BLB can be connected to the drain or source terminal of the switch (e.g., transistor), where the stored data can be written or read through BL and BLB.

The CiM cell 110 of the embodiment of the present disclosure can perform the storage of data (e.g., weights in a neural network), as well as the function of CiM such as multiplication within the cell and MAC within the array. Exemplarily, the weights are expressed as the difference between the voltages stored on the gate-source capacitance of transistor T2 and T3, thus equivalent to the conductance resistance RL and RR of the two differential transistors T2 and T3.

In an embodiment, the control module 20 may include a processing component that includes, but is not limited to, a separated processor, a discrete component, a combination of a processor and a discrete component. The processor may include a controller with instruction execution function in an electronic device, and the processor may be implemented in any appropriate way, for example, by one or more application specific integrated circuits (ASIC), digital signal processors (DSP), digital signal processing devices (DSPD), programmable logic devices (PLD), field programmable gate arrays (FPGAs), micro-processors, or other electronic components. Within the processor, the executable instructions can be executed through hardware circuits such as logic gates and switches.

Exemplarily, the control module 20 may also comprise a voltage converter module for outputting the desired voltage according to the instructions. The voltage conversion module may, for example, comprise a DC/DC module. Of course, the control module 20 may also connect wordlines and bitlines to external voltage sources in order to configure the appropriate voltage.

In a possible embodiment, the difference between the voltage between the control end and the second end of said second switch T2 and the voltage between the control end and the second end of said third switch T3 correlates with the stored value of said CiM cell 110.

The embodiment of the present disclosure does not limit the specific form of the correlation between the stored value of said CiM cell 110 and the difference between the voltage between the control end and the second end of the second switch T2 and the voltage between the control end and the second end of the third switch T3.

Exemplarily, the embodiment of the present disclosure may determine the stored value of the CiM unit 110 based on the difference between the voltage between the control end and the second end of the second switch T2 and the voltage between the control end and the second end of the third switch T3, as shown in FIG. 2. There is an overlapping capacitor (or a specially added capacitor) $C_{par}$ between the control end of the second switch T2 and the second end of the second switch T2, and also, there is an overlapping capacitor (or a specially added capacitor) $C_{par}$ between the control end of the third switch T3 and the second end of the third switch T3. The stored value can be determined according to the difference of the charge on the overlapping capacitors $C_{par}$ of the switch T2 and T3, i.e., according to the voltage difference of the overlapping capacitors.

In one example, the embodiment of the present disclosure may indicate the storage state by the difference of charge or voltage on the two overlapping capacitors $C_{par}$, i.e., the correlation may include that the stored data '1' corresponds to the state where the voltage on the overlapping capacitor $C_{par}$ of the second switch T2 is higher than the voltage on the overlapping capacitor $C_{par}$ of the third switch T3, and the stored data '0' corresponds to the state where the voltage on the overlapping capacitor $C_{par}$ of the second switch T2 is lower than the voltage on the overlapping capacitor $C_{par}$ of the third switch T3. The overlapping capacitor can refer to the gate-source capacitance or the gate-drain capacitance of a transistor, or the added capacitor between the control end of the switch and the first or second end of the switch, as required.

In a possible embodiment, the overlapping capacitor of the second switch T2 and the third switch T3 is greater than the overlapping capacitor of the first switch T1 and the fourth switch T4. Therefore, the embodiment of the present disclosure can reduce the disturbance to the stored stage of the CiM unit 110 when performing the CiM operations, and improve the accuracy of the calculation.

Figure 3:
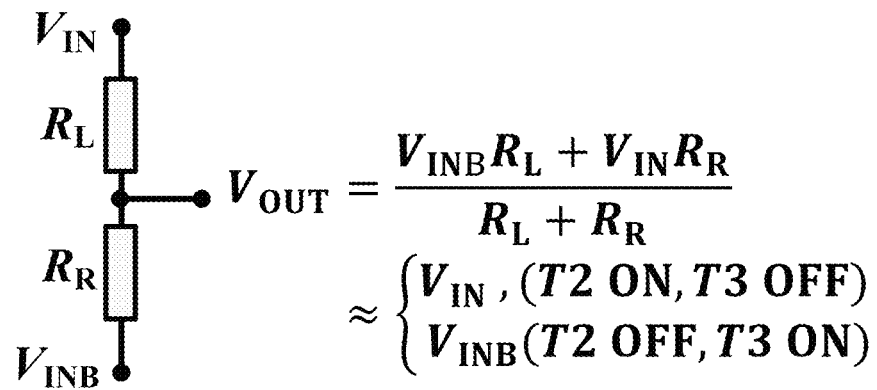
FIG. 3 is an equivalent diagram illustrating a second switch and a third switch based on an embodiment of the present disclosure.

Please refer to FIG. 3, which illustrates the equivalent diagram illustrating a second switch and a third switch based on an embodiment of the present disclosure.

Exemplarily, as shown in FIG. 3, the stored data of the CiM unit 110 can be read or calculate with inputs by applying input voltages on the second wordline IL and the third wordline ILB, where the voltage of the connection point of the second switch T2 and the third switch T3 of the differential structure (i.e. the first end of the second switch T2, the first end of the third switch T3) determine the result. For example, it can be modeled by the conductance resistance of the second switch T2 and the third switch T3, as shown in Eq. 1:

$$V_{OUT} = \frac{V_{INB}R_L + V_{IN}R_R}{R_L + R_R} \approx \begin{cases} V_{IN} (T2 \text{ turned on, } T3 \text{ turned off}) \\ V_{INB} (T2 \text{ turned off, } T3 \text{ turned on}) \end{cases} \quad \text{Eq. 1}$$

where $R_L$ denotes the conductance resistance of the second switch T2, RR denotes the conductance resistance of the third switch T3, VIN denotes the voltage on the second wordline IL, and $V_{INB}$ denotes the voltage on the third wordline ILB. Exemplarily, when the second switch T2 is turned on and the third switch T3 is turned off, the output voltage $V_{OUT}$ is approximately equal to the voltage VIN on the second wordline IL; when the second switch T2 is turned off and the third switch T3 is turned on, the output voltage $V_{OUT}$ is approximately equal to the voltage $V_{INB}$ on the third wordline ILB, as shown in FIG. 3.

Exemplarily, the operation of the control module 20 of the embodiment of the present disclosure on the CiM cell 110 and the CiM array 10 consisting of multiple CiM cells 110 is described below. The said operations include the read and write operation on the CiM cell 110, the read and write operation on any row of the CiM array 10, the in-memory computing operation on the CiM array 110, etc. The following is an exemplary description.

In an embodiment of the present disclosure, said control module 20 controls the voltage of the first wordline WL to turn off said first switch T1 and said fourth switch T4 of said CiM cell 110, so that said CiM cell 110 is in the standby state.

In an embodiment of the present disclosure, the voltage of the first wordline WL is controlled to keep the first switch T1 and the fourth switch T4 in the off state when no write operation is performed (e.g., initial state). In this state, the charge on the overlapping capacitors of said second switch T2 and third switch T3 is discharged slowly and has little disturbance from the first bitline BL and the second bitline BLB. Also, the state stored in the differential form is not easy to be flipped, thus said CiM cell 110 has a good stability.

In an embodiment of the present disclosure, said control module 20 is used to:

control the second wordline IL and the third wordline ILB to be the first preset voltage and control the voltage of the first bitline BL and the second bitline BL to be a differential voltage that corresponds to the state of the data to be written to said CiM cell;

control the voltage of the first wordline WL such that said first switch T1 and said fourth switch T4 are turned on to store said data;

control the voltage of the first wordline WL such that said first switch T1 and said fourth switch T4 are both off.

Exemplarily, the first preset voltage may be set as required, which is not restricted in this embodiment of the present disclosure, as long as the first preset voltage does not exceed the operation voltage allowed by the circuit, and the ratio of the conductance resistance of said second switch T2 and said third switch T3 or the ratio of the conductance resistance of said third switch T3 and said second switch T2 reaches above a certain threshold value after the write voltage, so that the stored state can be distinguished. For example, the first preset voltage may be 0 V.

In a possible embodiment, the write operation consists of the following steps. First, the second wordline IL and the third wordline ILB is kept at a certain voltage, i.e. the first preset voltage, and the state to be written is placed on the first bitline BL and the second bitline BLB in the form of a pair of differential high/low voltages. Second, the voltage of the first wordline WL is controlled to turn on the first switch T1 and the fourth switch T4, so that the state is written to the overlap capacitors of said second switch T2 and third switch T3. Finally, the voltage of the first wordline WL is controlled to turn off the first switch T1 and the fourth switch T4.

Figure 4:
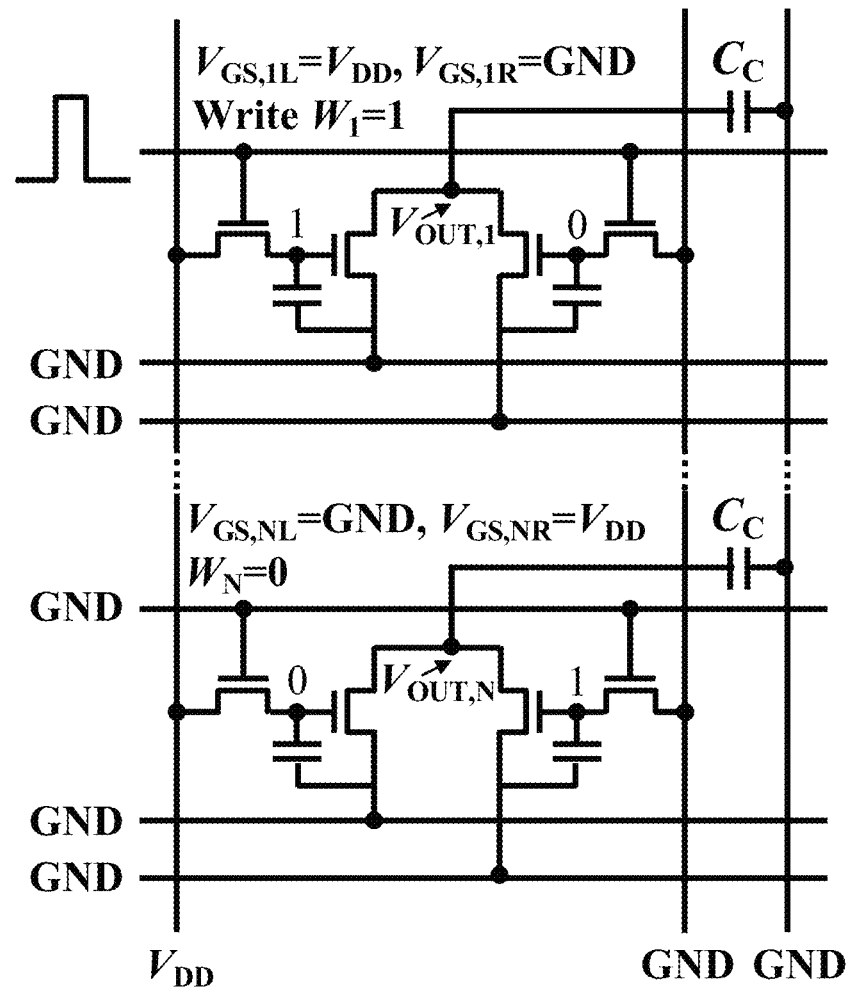
FIG. 4 is a schematic diagram illustrating the write operation to a CiM unit by the control module based on an embodiment of the present disclosure.

Please refer to FIG. 4, which is a schematic diagram illustrating the write operation to a CiM unit 110 by the control module based on an embodiment of the present disclosure.

Figures 5, 6:
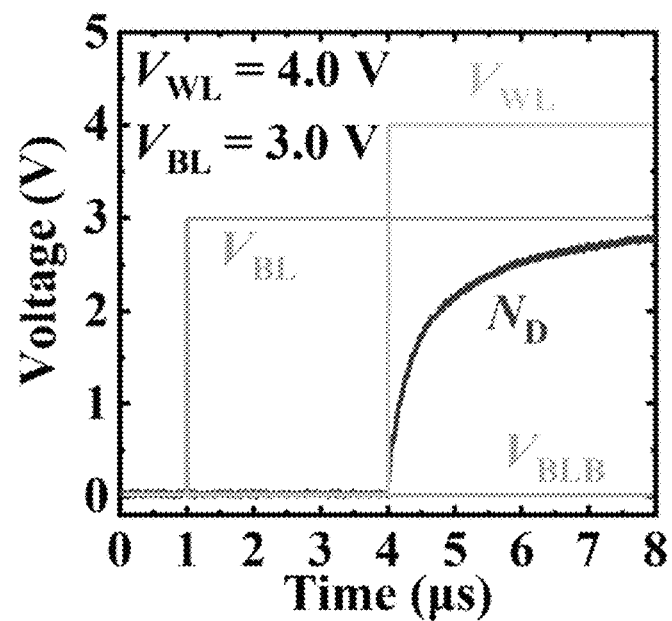
FIG. 5 is a schematic diagram illustrating the control voltages of the control module based on an embodiment of the present disclosure.
FIG. 6 is a waveform diagram illustrating the write operation based on an embodiment of the present disclosure.

Please refer to FIG. 5, which is a schematic diagram illustrating the control voltages of the control module based on an embodiment of the present disclosure.

Please refer to FIG. 6, which is a waveform diagram illustrating the write operation based on an embodiment of the present disclosure.

In an example, as shown in FIG. 4, FIG. 5, and FIG. 6, the write operation consists of the following steps. First, the control module 20 sets the second wordline IL and the third wordline ILB to 0 V, and applies differential voltages 0 V/3V or 3V/0 V on the first bitline BL and the second bitline BLB, which represents stored data of "0" or "1", respectively. Second, the first wordline WL is set to 4V, thus the data voltage is written to the gate-source overlapping capacitor $C_{par}$ of the second switch T2 and the third switch T3. Finally, after the writing is finished, the first wordline WL is reset to 0 V. When not performing the write operation, the voltage of the first wordline WL is kept at 0 V so that the overlapping capacitor $C_{par}$ can persist the stored data.

Of course, it should be understood that the illustration of the voltages for each wordline and each bitline in FIG. 5 and other parts is exemplary under a particular TFT process. It should be understood that even for the same type of TFT (e.g., metal-oxide TFT), the operating voltages will be fundamentally different because of the different processes. For example, exploiting the same materials as the transistor channel, it is possible to implement TFTs with operating voltages around −10 V or around −3V, so the range of voltages for each wordline and bitline can be determined according to the actual situation, where this disclosure embodiment is not restricted. For example, this disclosure of the present embodiment illustrates the voltage of the first wordline WL as 4V exemplarily, but the voltage of the first wordline WL is not limited to this, as long as the first switch T1 and the fourth switch T4 can be turned on sufficiently. Also, the voltage for the first wordline WL is related to the type of transistors used in the first switch T1 and the fourth switch T4, e.g., in some embodiments, the voltage that turns the first switch T1 and the fourth switch T4 on may be a low voltage. This is not limited by the embodiment of the present disclosure.

In an embodiment of the present disclosure, the CiM operations comprise multiplication calculation between the input analog data and the stored data, where the stored data is in said CiM cell 110. Said control module 20 is used to:
control the voltage of the second wordline IL as the first analog voltage that corresponds to said input analog data;
control the third wordline ILB as the second preset voltage;
determine the computing result of the multiplication between the input analog data and the stored data by the voltage at the first end of said coupling capacitor $C_C$.

In a possible implementation, when performing the multiplication operation between input analog data and stored binary data (e.g., input data and weight data of a neural network), the control module 20 may apply a certain analog voltage to the second wordline IL as input data and a fixed voltage (the second preset voltage, typically 0 V) to the third wordline ILB, and the voltage of the lower plate of the coupling capacitor $C_C$ represents the result of the multiplication between the input analog data and the stored binary data. Exemplarily, when the stored data is "1", the computing result is approximately the analog voltage represented by the input data; when the stored data is "0", the computing result is approximately the fixed voltage.

In the above way, the embodiment of the present disclosure can show advantages of low circuit complexity, low power consumption, high computing accuracy, and fast computing speed.

In an embodiment of the present disclosure, the CiM operations comprise the XNOR calculation between the input digital data and the stored data, where the stored data is in said CiM cell 110. Said control module 20 is used to:
control the voltage of the second wordline IL and the third wordline ILB as a differential voltage that corresponds to said input digital data;
determine the computing result of XNOR between the input digital data and the stored data by the voltage at the first end of said coupling capacitor $C_C$.

In a possible implementation, the input digital data can also be referred to as binary data (0 or 1). Exemplarily, when performing an XNOR logic between the input binary data and the stored binary data, the control module 20 can apply a pair of differential voltages in the form of high and low voltages to the second wordline IL and third wordline ILB representing the input data, and the voltage of the lower plate of the coupling capacitor $C_C$ represents the result of the XNOR logic between the input binary data and the stored binary data.

In an example, it can be defined that the input data is "1" when the voltage of the second wordline IL and the third wordline ILB is high and low, respectively; and that the input data is "0" when the voltage of the second wordline IL and the third wordline ILB is low and high, respectively.

In an example, the resulting voltage is approximately a high voltage, indicating a result of "1", when the stored data is "1" and the input data is "1".

In an example, the resulting voltage is approximately a low voltage, indicating a result of "0", when the stored data is "0" and the input data is "1".

In an example, the resulting voltage is approximately a low voltage, indicating a result of "0", when the stored data is "1" and the input data is "0".

In an example, the resulting voltage is approximately a high voltage, indicating a result of "1", when the stored data is "0" and the input data is "0".

In an embodiment of the present disclosure, said CiM array 10 comprises M rows and N columns, where M and N are integers greater than 0. The first wordline WL, the second wordline IL, and the third wordline ILB of the CiM cells 110 in the same row of said CiM array 10 are connected respectively, and/or, the first bitline BL, the second bitline BLB, and the third bitline RL of the CiM cells 110 in the same column of said CiM array 10 are connected respectively.

In an embodiment of the present disclosure, said control module 20 is used to:

control the second wordline IL and the third wordline ILB of the target row to be the first preset voltage, and control the voltages of the first bitline BL and the second bitline BLB of each CiM cell 110 in the target row to be differential voltages corresponding to the data being written to each CiM cell 110 in said target row;

control the voltage of the first wordline WL of said target row such that said first switches T1 and said fourth switches T4 are turned on to store the data being written to said target row.

In a possible embodiment, the embodiment of the present disclosure can perform the write operation for each CiM unit 110 row by row. Exemplarily, the write operation for the target row consists of the following steps. First, the control module 20 applies a fixed voltage (first preset voltage) to the second wordline IL and the third wordline ILB of the target row, and applies a differential voltage representing the data to be written for each column to the first wordline BL and second wordline BLB. Second, it controls the voltage of the first wordline WL of the target line to store the desired state on the overlapping capacitors of said second switch T2 and said third switch T3 of the CiM cells 110 of the target row.

In an embodiment of the present disclosure, said control module 20 is used to:

ground each third bitline RL for the first duration and then control each third bitline RL to be floating;

control the second wordline IL of the target row to be the third preset voltage, and control the third wordline ILB of the target row, the second wordlines ILs of the other rows, and the third wordlines ILBs of the other rows to be the second preset voltage;

determine the stored data of the corresponding CiM cells 110 by the voltages of each third bitline RL, which corresponds to the data read results of the target row.

In a possible implementation, the read operation of a the target line consists of the following steps. First, the control module 20 grounds all third bitlines RL of the CiM array 10 and then control each third bitline RL to be floating. Second, sets the second wordline IL of the target row to the third preset voltage (e.g., 1V), sets the third wordline ILB of the target row and the second wordline IL and third wordline ILB of the remaining rows to the second preset voltage (e.g. 0 V). The result of the read operation is distinguished by the change of the voltage on the third bitline RL.

Exemplarily, if the voltage on the third bitline RL is a high voltage, the stored data can be determined as "1"; if the voltage on the third bitline RL is a low voltage, the stored data can be determined as "0".

In an embodiment of the present disclosure, said CiM operations comprise the matrix-vector multiplication between the input analog one-dimensional vector and the stored two-dimensional matrix, where the stored matrix is in said CiM array 10. Said control module 20 is used to:

ground each third bitline RL for the first duration and then control each third bitline RL to be floating;

control the voltages of each second wordline IL to be the analog voltages corresponding to the analog data input to each row;

control the third wordlines ILBs to be the second preset voltage;

determine the matrix-vector multiplication result by the voltages of each third bitline RL.

In an embodiment of the present disclosure, said device determines the matrix-vector multiplication result by the voltage of each third bitline RL, comprising:

combining the states corresponding to the voltages of each third bitline RL to obtain said matrix-vector multiplication result.

In a possible implementation, the CiM array 10 can perform the matrix-vector multiplication between a one-dimensional analog input vector and a two-dimensional binary matrix stored in the CiM array 10. Exemplarily, the control module 20 may first ground all third wordlines RLs of the CiM array 10 for discharging, then control each third bitline to be floating. Second, apply the analog voltages representing input data of each row to the second wordlines ILs, and apply a fixed voltage (the second preset voltage, typically 0 V) to the third wordlines ILBs of the CiM array 10. The results of the multiplication operation of each CiM cell 110 in the same column are coupled to the third bitline RL through the coupling capacitor $C_C$, then the voltage of the bitline RL is equal to the average of the voltage on the bottom plates of the coupling capacitors $C_C$ of each CiM cell 110 in the same column. Thus the MAC result of the column can be distinguished by the change of the voltage on the third bitline RL. Exemplarily, the present disclosure embodiment can obtain the matrix-vector multiplication result by combining the MAC results of all columns. For example, if the MAC operation result of two columns is 10 and 20 respectively, the result of matrix-vector multiplication is [10, 20].

In an embodiment of the present disclosure, said CiM operations comprise matrix-vector multiplication between the input digital one-dimensional vector and the stored two-dimensional matrix, where the stored matrix is in said CiM array 10. Said control module 20 is used to:

ground each third bitline RL for the first duration and then control each third bitline RL to be floating;

control the voltages of the second wordlines ILs and the third wordlines ILBs of each row to be differential voltages corresponding to the digital data input to each row;

determine the matrix-vector multiplication result by the voltages of each third bitline RL.

In a possible implementation, the CiM array 10 can perform the matrix-vector multiplication between a one-dimensional binary input vector and a two-dimensional binary matrix stored in the CiM array 10. Exemplarily, the control module 20 may first ground all third wordlines RLs of the CiM array 10 for discharging, then control each third bitline to be floating. Second, apply the differential high/low voltages representing input data of each row to the second wordlines ILs and the third wordlines ILBs of the CiM array 10. The results of the XNOR operation of each CiM cell 110 in the same column are coupled to the third bitline RL through the coupling capacitor $C_C$, then the voltage of the bitline RL is equal to the average of the voltage on the bottom plates of the coupling capacitors $C_C$ of each CiM cell 110 in the same column. Thus the MAC result of the column can be distinguished by the change of the voltage on the third bitline RL. Exemplarily, the present disclosure embodiment can obtain the matrix-vector multiplication result by combining the MAC results of all columns.

Figure 7:
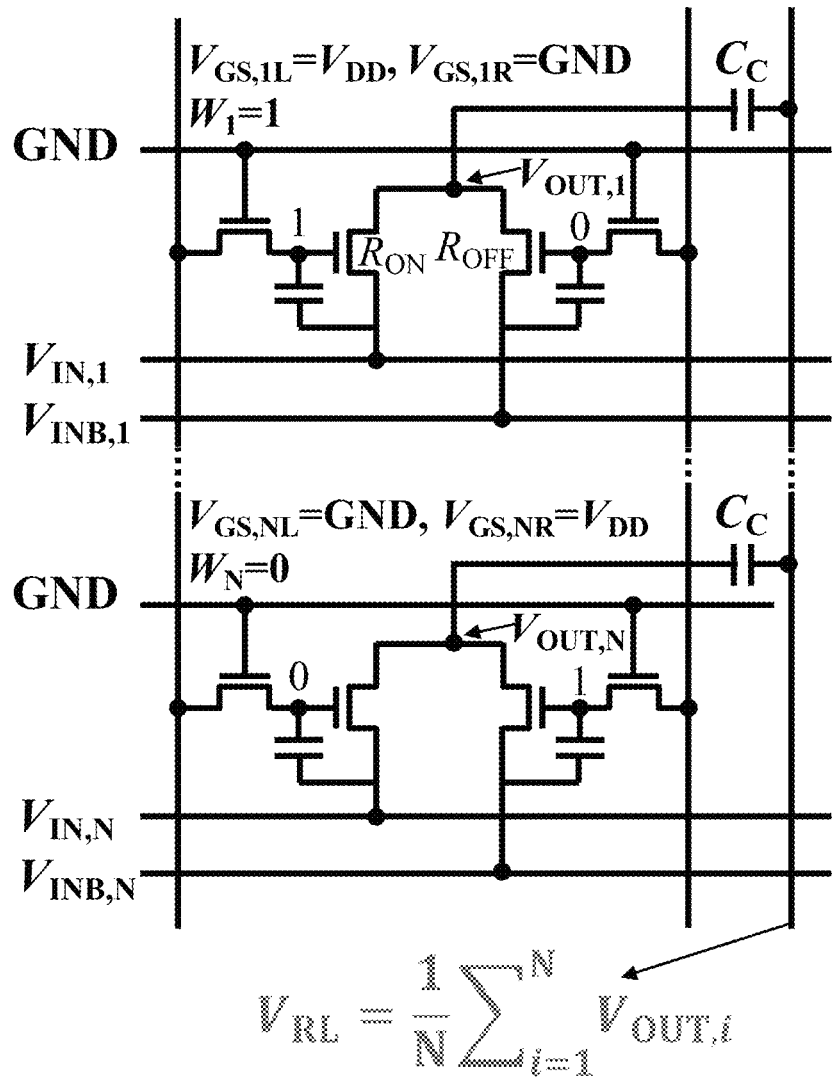
FIG. 7 is a schematic diagram illustrating the control module 20 controlling the CiM array 10 for matrix-vector multiplication based on an embodiment of the present disclosure.

Please refer to FIG. 7, which is a schematic diagram illustrating the control module 20 controlling the CiM array 10 for matrix-vector multiplication based on an embodiment of the present disclosure.

Exemplarily, as shown in FIG. 7, the control module 20 of the embodiment of the present disclosure may control the CiM array 10 to perform matrix-vector multiplication between the analog input data and the stored binary data, or the control module 20 of the embodiment of the present disclosure may control the CiM array 10 to perform matrix-vector multiplication between the binary differential input data and the stored binary data.

Exemplarily, as shown in FIG. 7, the matrix-vector multiplication between a one-dimensional analog input vector and a two-dimensional binary matrix stored in the CiM array 10 consists of the following steps. First, the control module 20 grounds all third wordlines RLs to discharge to 0 V, then control each third bitline to be floating. Second, apply the analog voltages representing input data of each row to the second wordlines ILs, and apply 0 V to the third wordlines ILBs. The results of the multiplication operation of each CiM cell 110 in the same column are coupled to the third bitline RL through the coupling capacitor $C_C$, thus the MAC result of the column can be distinguished by the change of the voltage on the third bitline RL.

Exemplarily, as shown in FIG. 7, the matrix-vector multiplication between a one-dimensional binary input vector and a two-dimensional binary matrix stored in the CiM array 10 consists of the following steps. First, the control module 20 grounds all third wordlines RLs to discharge to 0 V, then control each third bitline to be floating. Second, apply the differential 0 V/1V or 1V/0 V representing input data of each row to the second wordlines ILs and the third wordlines ILBs. The results of the XNOR operation of each CiM cell 110 in the same column are coupled to the third bitline RL through the coupling capacitor $C_C$, thus the MAC result of the column can be distinguished by the change of the voltage on the third bitline RL.

Figure 8:
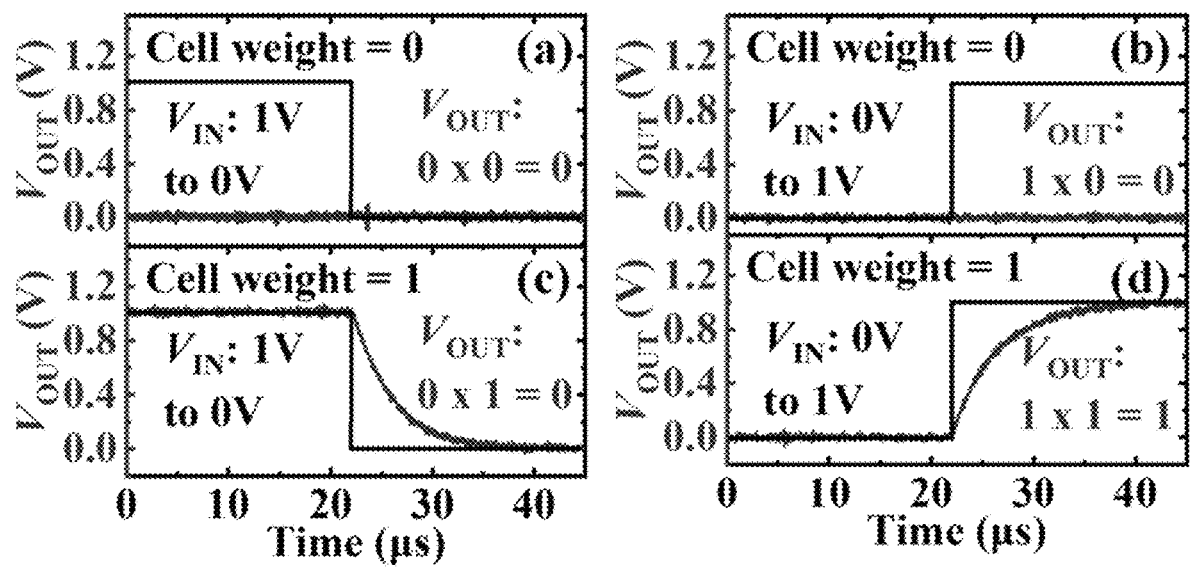
FIG. 8 is a waveform diagram illustrating matrix-vector multiplication between input analog data and stored binary data based on an embodiment of the present disclosure.

Please refer to FIG. 8, which is a waveform diagram illustrating matrix-vector multiplication between input analog data and stored binary data based on an embodiment of the present disclosure.

As shown in FIG. 7 and FIG. 8, the voltage of the bottom plate of the coupling capacitor $C_C$ of the CiM cell 110 in the $k^{th}$ row, $V_{OUT,k}$, is the result of analog multiplication or logic XNOR, and is coupled to the third bitline RL through the coupling capacitor $C_C$. After the simultaneous turning on multiple rows of CiM cells 110, the voltage on the third bitline RL is the average of $V_{OUT,k}$ according to the principle of charge conservation, which represents the value of the MAC result of this column. The matrix-vector multiplication result can be obtained by combining the MAC results of all columns. To reduce the disturbance to the stored state of CiM cell 110 during the calculation, the overlapping capacitance of the transistors T2 and T3 needs to be sufficiently larger than the transistors T1 and T4 in the layout design.

Figure 9:
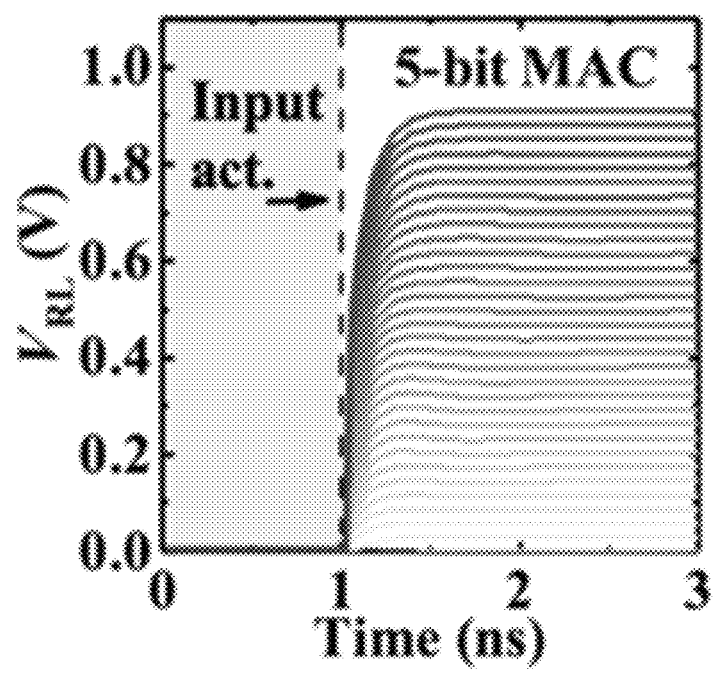
FIG. 9 is a waveform diagram illustrating a 5-bit MAC operation based on an embodiment of the present disclosure.

Please refer to FIG. 9, which is a waveform diagram illustrating a 5-bit MAC operation based on an embodiment of the present disclosure.

The accuracy of the accumulation operation exploiting capacitive coupling in the embodiment of the present disclosure is guaranteed by the principle of charge conservation. The operation does not consume DC power, and also, does not require precise timing control. Moreover, $V_{OUT,k}$ is determined by the ratio between conductance resistance RL and RR of the series-connected transistor rather than the absolute value of the conductance resistance in the on- or off-state, as shown in FIG. 3. Therefore, $V_{OUT,k}$ is not sensitive to stored charge leakage and variation. As a result, the charge-domain CiM calculation with differential CiM cells can tolerate more leakage and transistor variation than the single-end current-domain CiM calculation. Also, the charge-domain CiM can be easily extended to MAC operation with higher parallelism.

Figure 10:
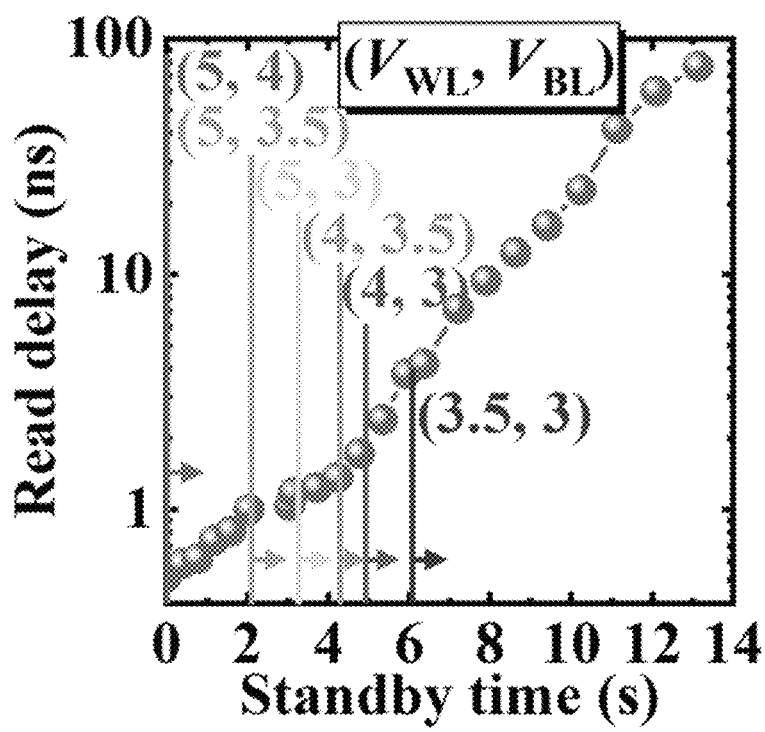
FIG. 10 illustrates the relationship between the data refresh interval and the read latency of the CiM device based on an embodiment of the present disclosure.

Please refer to FIG. 10, which illustrates the relationship between the data refresh interval and the read latency of the CiM device based on an embodiment of the present disclosure.

Exemplarily, as shown in FIG. 10, when the data refresh interval is longer, the on-state resistance of the transistor will be larger, so the read latency will be longer accordingly, but the accuracy of the computing result can still be guaranteed.

Figure 11:
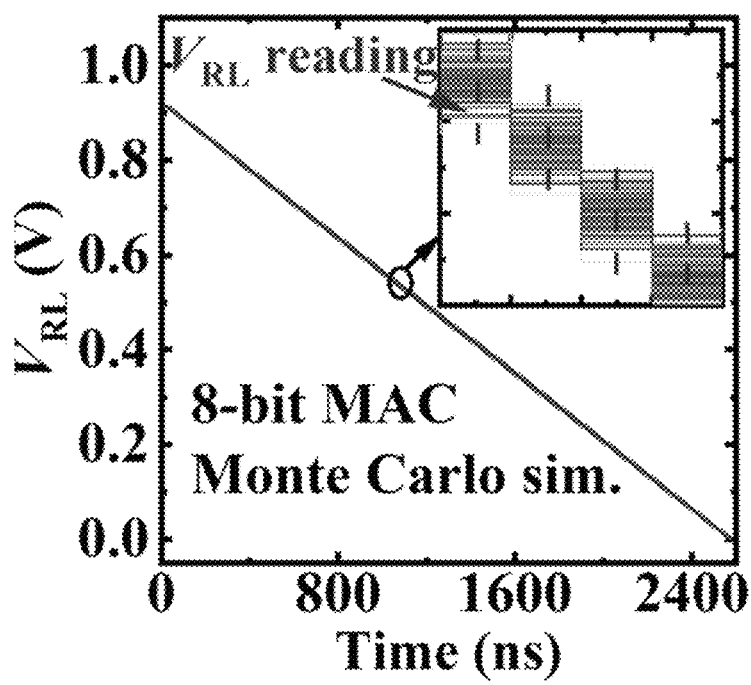
FIG. 11 is a Monte Carlo simulation diagram illustrating the CiM operation based on an embodiment of the present disclosure.

Please refer to FIG. 11, which is a Monte Carlo simulation diagram illustrating the CiM operation based on an embodiment of the present disclosure.

The Monte Carlo simulation shown in FIG. 11 takes into account of the variation of the capacitance and the threshold voltage. It shows that the MAC result still maintains a good linearity under the variation, which can achieve an accuracy of 8 bits for the 128-row MAC operation.

Figure 12:
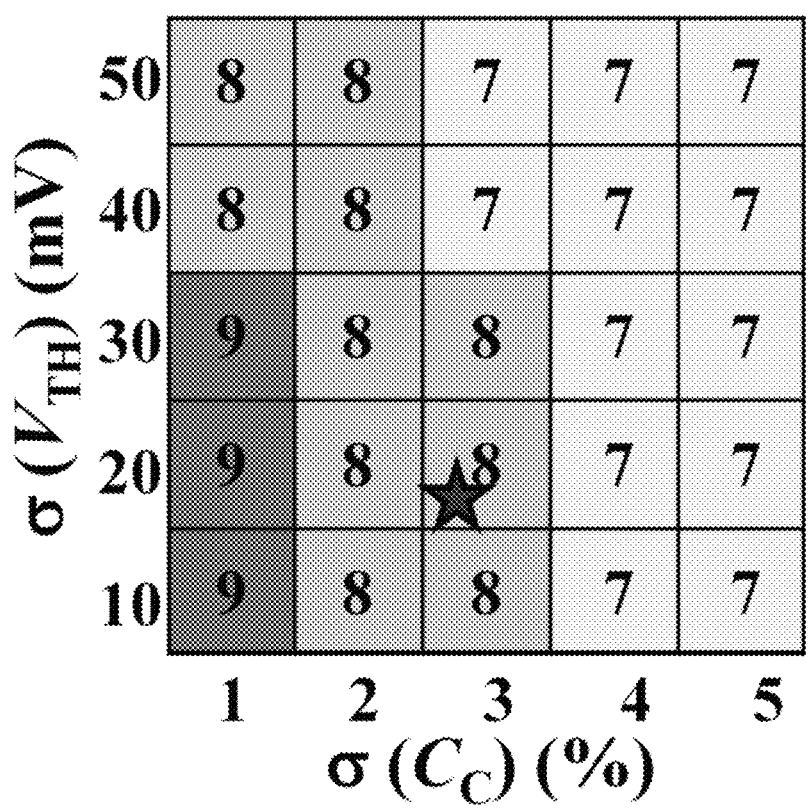
FIG. 12 is a schematic diagram illustrating the accuracy achieved by the CiM device based on an embodiment of the present disclosure.

Please refer to FIG. 12, which is a schematic diagram illustrating the accuracy achieved by the CiM device based on an embodiment of the present disclosure.

Exemplarily, as shown in FIG. 12, the output voltage has different accuracy under different variations of capacitance ($\sigma(C_C)$) and threshold voltage ($\sigma(V_{TH})$). For a CiM device under the 45 nm IGZO TFT process, the accuracy can archive 8 bits as marked by the pentagram in FIG. 12. It can be seen that the embodiment of the present disclosure has high accuracy, high reliability, high energy efficiency, and support for computing with massive parallelism. The benefits make it suitable for TFT process, which has characteristics of low-cost large-area fabrication and device performance of low mobility and high variation.

The "accuracy" in the embodiment of the present disclosure refers to the highest number of bits that can be achieved when the output voltages can be distinguished from each other under the given variation of capacitance ($\sigma(C_C)$) and threshold voltage ($\sigma(V_{TH})$), assuming that the actual output voltage corresponding to each ideal output voltage is distributed within $\pm 3\sigma$. Considering the variations, the output voltage is approximately the superposition of multiple Gaussian distributions with the ideal output voltage as the mean value.

Figure 13:
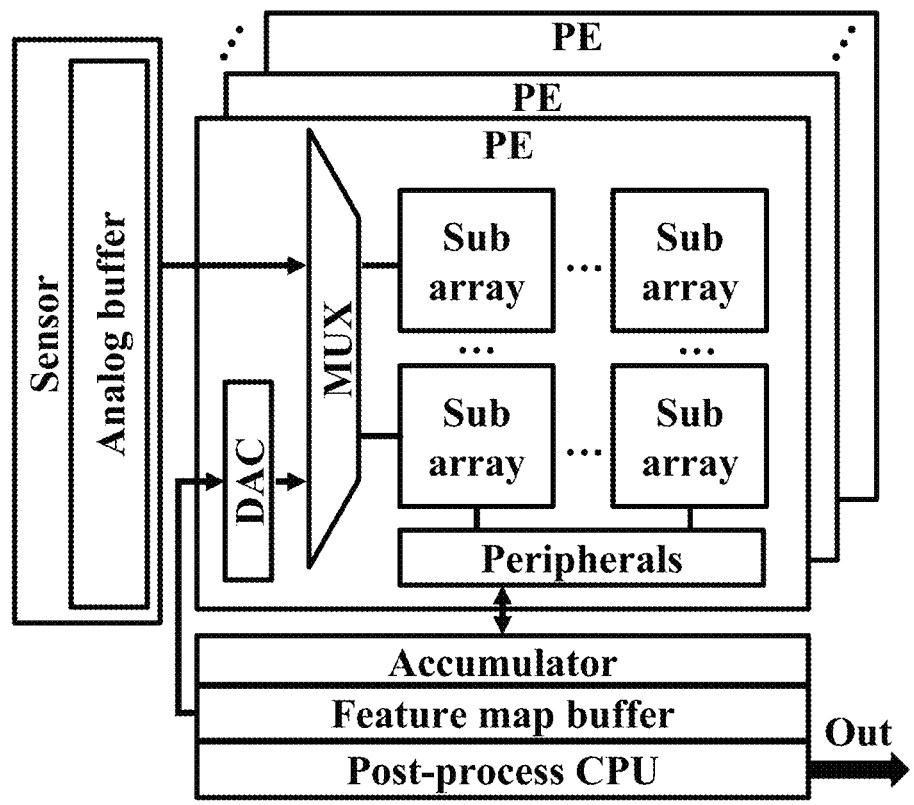
FIG. 13 is a schematic diagram illustrating the system architecture of a neural network accelerator including said CiM array based on an embodiment of the present disclosure.

Please refer to FIG. 13, which is a schematic diagram illustrating the system architecture of a neural network accelerator including said CiM array based on an embodiment of the present disclosure.

Exemplarily, as shown in FIG. 13, said accelerator includes a sensor array, multiple data processing units, an accumulation circuit, a buffer for feature map, and a post-processing unit.

Exemplarily, the sensor array includes multiple sensors for acquiring sensing data to be processed. Said sensors may be CCD (Charge-Coupled Device), CMOS (Complementary Metal Oxide Semiconductor), and other optical sensors, large-area thin-film pressure sensor and photonic sensors, etc., which are not limited by the embodiment of the present disclosure. Exemplarily, the sensor array may be implemented as a camera, a video camera, a touch screen, etc., and said sensing data may include image data, touch data, etc. The sensor array may also include an analog buffer, which is used to buffer the sensor data, wherein the analog buffer may be implemented using a source follower, a unit-gain negative feedback amplifier, etc. Exemplarily, the sensor array may perform data acquisition by a scan interface, and the acquired sensing data may be output through the read interface to the data processing unit directly or with queue processing (e.g., FIFO, LIFO).

Exemplarily, the data processing unit may include digital-to-analog converters, selectors, multiple CiM arrays 10, and peripheral sensing circuits, wherein the digital-to-analog converters are used to perform digital-to-analog conversion of the input data to the next layer of the neural network; the selectors may be a multiplexer, which may select the source of the input data from sensor arrays or data buffer, and feed the input data of the layer to each CiM array 10; the peripheral sensing circuits (e.g. analog-to-digital converters) are used to distinguish the outputs from the CiM arrays 10, which is used to obtain the matrix-vector multiplication results from the CiM array 10; the accumulation circuits are used to further accumulate the matrix-vector multiplication results of each CiM array 10 to obtain the final output feature map of the present layer; the feature map buffers are used to temporarily store the calculated feature maps. Of course, the data processing unit can also include analog circuits (e.g., compensators, amplifiers) to apply compensation, amplification, and other analog operations to the calculation results. Exemplarily, the digital data from peripheral sensing circuits can be stored in memory or storage. Exemplarily, the memory may include a computer-readable storage medium, which may be a device that can store instructions used by an instruction execution device, for example, but not limited to, an electrical storage device, a magnetic storage device, an optical storage device, an electromagnetic storage device, a semiconductor storage device, or any suitable combination of the above. More specific examples of computer-readable storage media (a non-exhaustive list) include: portable computer disks, hard disks, random access memory (RAM), read-only memory (ROM), erasable programmable read-only memory (EPROM or flash memory), static random access memory (SRAM), programmable read-only memory (PROM), portable compact disk read-only memory (CD-ROM), digital versatile disks (DVDs), memory sticks, floppy disks, mechanical coding devices, punched cards or raised structures with instructions stored thereon, and any suitable combination of the foregoing.

Exemplarily, the post-processing circuit may be used to perform other operations in the neural network and output results, which may include a communication processor including general-purpose processors such as a central processing units (CPUs), and intelligence processing units (IPU) for performing artificial intelligence operations such as graphics processing units (GPUs), neural network processing units (NPUs), digital signal processors (DSPs), field-programmable gate arrays (FPGAs), and any suitable combination of the foregoing. The communication processor may also have integrated communication functions for data transmissions, such as communication with other modules and other devices, e.g., access to wireless networks including WiFi, 2G, and 3G, and a combination thereof.

Of course, the embodiment of the present disclosure does not limit the specific implementation of the sensor array, the digital-to-analog converter, the selector, the peripheral sensing circuit, the accumulation circuit, the feature map buffer, and the post-processing circuit. Those skilled in the art can choose a suitable implementation according to the actual situation and requirement.

The embodiment of the present disclosure uses the accelerator architecture shown in FIG. 13 to evaluate the performance of the CiM array 10 in neural network applications.

Figure 14:
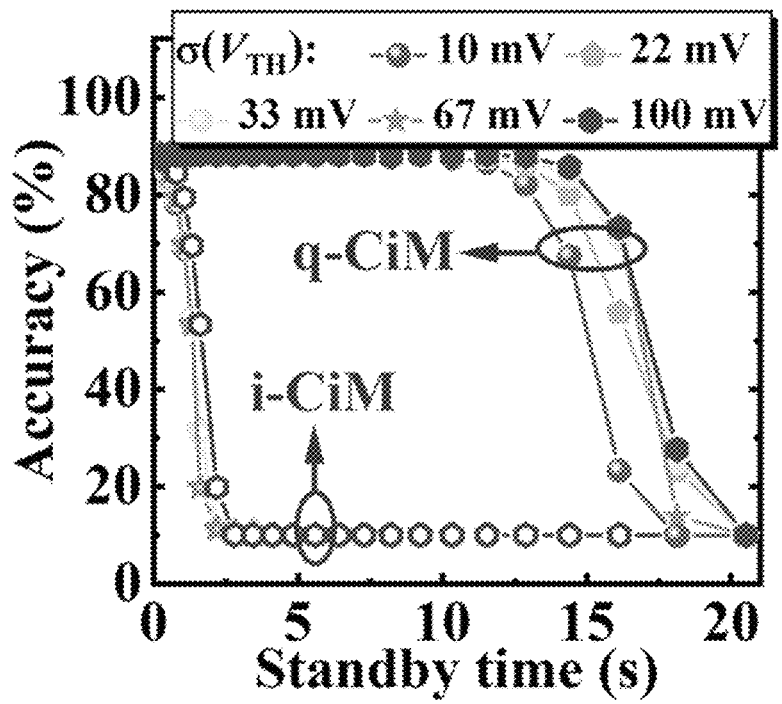
FIG. 14 is a schematic diagram illustrating the CiM device under different process variations and different data refresh intervals based on an embodiment of the present disclosure.

Please refer to FIG. 14, which is a schematic diagram illustrating the CiM device under different process variations and different data refresh intervals based on an embodiment of the present disclosure.

Exemplarily, said accuracy of the neural network may refer to the accuracy achieved by the inference results obtained with a test set fed into the hardware-implemented neural network.

Exemplarily, as shown in FIG. 14, the embodiment of the present disclosure can achieve data retention times of up to the order of ten seconds guaranteeing high accuracy, whereas only seconds can be achieved for CiM work in the current domain. The improvement of data retention time in order of magnitude is due to the differential structure of the CiM cell 110 of the embodiment of the present disclosure. Exemplarily, the switches in the embodiment of the present disclosure can be implemented by transistors with low leakage characteristics, which can form an almost-nonvolatile memory, that data in the CiM cells can be stored for a long time, for example, the transistors have leakage current less than a preset value. The embodiment of the present disclosure does not limit the preset value of the leakage current, as long as the transistor can meet the low leakage requirement, e.g., the preset value can be $10^{-20}$ A. Transistors satisfying the low leakage characteristics may include a variety of types of transistors, which are not limited by the embodiment of the present disclosure, for example, IGZO TFTs. Due to the ultra-low leakage characteristic of IGZO TFTs, the required data refresh interval is long to achieve better energy efficiency in typical edge computing scenarios with sparse events. Of course, in other implementations, other transistors with low leakage characteristics may also be used.

The advantages of TFTs enable a wide range of edge applications with high edge processing performance when applying CiM architectures. First, TFTs are widely used in sensing, leading to a fusion of CiM and sensing units. The combination of sensing, storage, and computing can greatly reduce the cost of data transfer. In addition, there are many advantages of TFTs in fabrication, such as transparency, flexibility, and large-area integration, extending their application scenarios. It provides a new direction for the further development of CiM and intelligent sensing. IGZO TFTs can achieve leakage current density of $10^{-16}$ A/m, and even lower with special processes. Low leakage is a competitive feature in storage applications. Taking DRAM structure as an example, frequent refreshing is required in conventional CMOS-based DRAM due to the high leakage current, while the refresh frequency of TFT-based DRAM can be much lower, saving energy and increasing the access window. Therefore, TFTs have great potential in the field of CiM.

Figure 15:
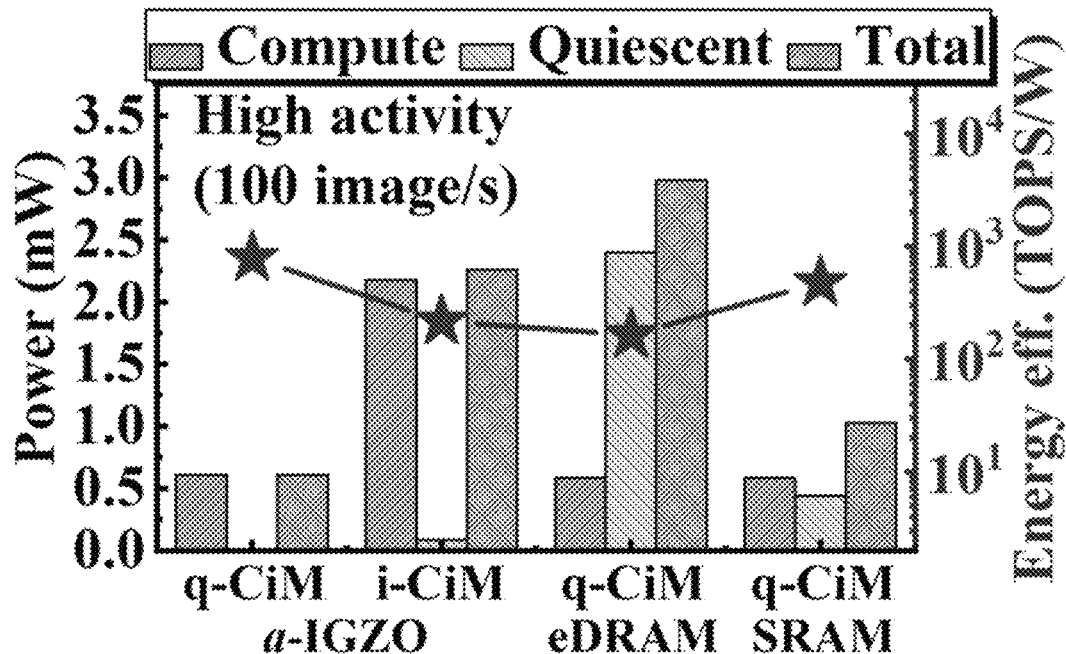
FIG. 15 is a comparison diagram of the power consumption of the CiM array based on an embodiment of the present disclosure compared with other CiM solutions evaluated in the image classification application at high event activity.
Figure 16:
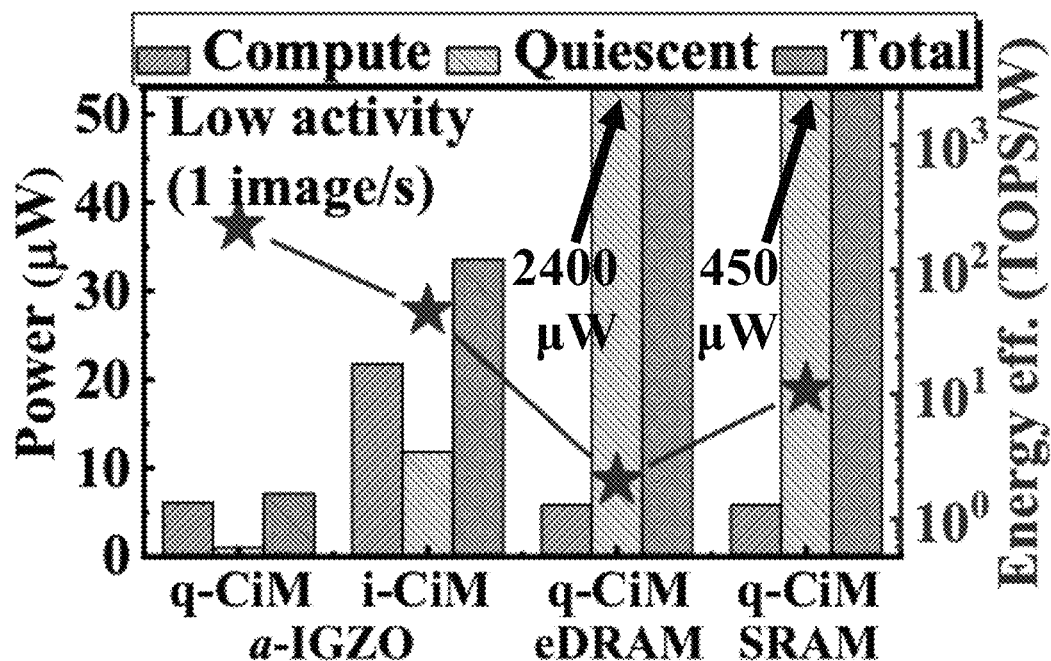
FIG. 16 is a comparison diagram of the power consumption of the CiM array based on an embodiment of the present disclosure compared with other CiM solutions evaluated in the image classification application at low event activity.

Please refer to FIG. 15, FIG. 16, and FIG. 17. FIG. 15 is a comparison diagram of the power consumption of the CiM array based on an embodiment of the present disclosure compared with other CiM solutions evaluated in the image classification application at high event activity. FIG. 16 is a comparison diagram of the power consumption of the CiM array based on an embodiment of the present disclosure compared with other CiM solutions evaluated in the image classification application at low event activity. FIG. 17 is a comparison diagram of the power consumption of the CiM array based on an embodiment of the present disclosure compared with other CiM solutions evaluated in the image classification application at high event activity and at low event activity.

In the figures, "q-CiM" denotes charge-domain CiM, "i-CiM" denotes current-domain CiM, "a-IGZO eDRAM" denotes eDRAM CiM based on IGZO TFT (which contains charge-domain q-CiM and current-domain i-CiM, where q-CiM is the scheme of the embodiment of the present disclosure, and i-CiM is the scheme in the related technology), "CMOS eDRAM" denotes the eDRAM CiM scheme based on silicon CMOS (the CMOS eDRAM q-CiM use the circuit topology of the embodiment of the present disclosure), and "CMOS SRAM" denotes the scheme in which the transistors use silicon-based CMOS and use SRAM as storage.

As shown in FIG. 15, FIG. 16, and FIG. 17, for the high-event-frequency recognition task (100 images per second), the total power consumption of the CiM array 10 of the embodiment of the present disclosure is 599 μW, while all related technologies are greater than 1000 μW. For the low-event-frequency recognition task (1 image per second), the total power consumption of the CiM array 10 of the embodiment of the present disclosure is 6.98 μW, while all related technologies are greater than 30 μW. It can be concluded that, at a low recognition frequency of 1 image per second, the embodiment of the present disclosure has a significant advantage in power consumption, thanks to the reduced performance overhead due to leakage, which can achieve a low standby power.

Please refer to FIG. 18, which is a comparison diagram of the CiM device based on an embodiment of the present disclosure with other CiM solutions in the related arts.

The superscripts in FIG. 18 has the following meanings. "$a$" indicates the performance in the related arts where only the CiM array is included. "$b$" indicates the performance in the related arts where the CiM array and the peripheral circuits are both included. "$c$" indicates that the bit configuration of the weights, activation and outputs used in the evaluation of the neural network application is 4 bits, 4 bits, and 8 bits, respectively. "$d$" indicates the performance of the related art without sparsity optimization.

As shown in FIG. 18, thanks to the computing process without static power and the standby state with low refresh frequency, the embodiment of the present disclosure can archive high energy efficiency of 2092 TOPS/W (including the CiM array 10 only) and 795 TOPS/W (including both the CiM array 10 and peripheral circuits), where TOPS/W is used to measure how many trillions of operations the processor can perform under 1 J (joules) of energy.

In summary, the embodiment of the present disclosure proposes a 4-switch 1-capacitor (4T1C) differential CiM cell and charge-domain in-memory MAC operations. Due to the differential CiM cell design, the stored data is only dependent on the ratio of conductance resistance rather than the absolute one, so the embodiment of the present disclosure can significantly extend the data retention time, thus reducing the refresh overhead. The charge-domain computing scheme is insensitive to variation of transistors, leading to high linearity of results, high reliability of calculations, and allowing massively parallel MAC operation. By using 45 nm IGZO TFT process for evaluation, for 128 rows of 8-bit MAC operation, longer retention of more than 50 times than the existing current domain computing can be achieved, which reduces power consumption for refresh in standby mode. Moreover, the embodiment of the present disclosure can tolerate variation of threshold voltage ($V_{TH}$) and coupling capacitance ($C_C$) of up to 50 mV and 2% in standard deviation, respectively. By simple timing control and DC-current-free charge-domain operations, the embodiment of the present disclosure has low sensing complexity and high energy efficiency.

The embodiment of the present disclosure has been described above. The above description is exemplary rather than exhaustive, and also, is not limited to the disclosed embodiments. Without being out of the scope and spirit of the illustrated embodiments, multiple modifications and changes will be obvious to those of ordinary skill in the art. The terms used herein have been selected to best explain the principles, practical applications, or improvements to the technologies in the market of each embodiment, and to enable others of ordinary skill in the art to understand the various embodiments disclosed herein.

What is claimed is:

1. A Computer-in-Memory (CiM) device comprising:
a CiM array comprising at least one CiM cell comprising a first switch, a second switch, a third switch, a fourth switch, a coupling capacitor, a first bitline, a second bitline, a third bitline, a first wordline, a second wordline and a third wordline, wherein a first end, a second end and a control end of the first switch are connected to the first bitline, a control end of the second switch and the first wordline respectively, a first end of the second switch is connected to a first end of the third switch and to a first end of the coupling capacitor respectively, a second end of the second switch is connected to the second wordline, a control end and a second end of the third switch are connected to a first end of the fourth switch and the third wordline respectively, a control end and a second end of the fourth switch are connected to the first wordline and to the second bitline respectively, a second end of the coupling capacitor is connected to the third bitline; and
a control module, connected to said CiM array, controlling voltage states of each wordline and each bitline, whereby data is read and written through said CiM array, or CiM operations are performed,
wherein said CiM array comprises M rows and N columns, wherein M and N are integers greater than 0, the first wordline, the second wordline, and the third wordline of CiM cells in same row of said CiM array are connected respectively, and the first bitline, the second bitline, and the third bitline of CiM cells in same column of said CiM array are connected respectively,
wherein said CiM operations comprise a matrix-vector multiplication between an input analog one-dimensional vector and a stored two-dimensional matrix, wherein the two-dimensional matrix is stored in said CiM array and said control module is used to:
ground each third bitline for a first duration and control each third bitline to be floating;
apply analog voltages to each second wordline, wherein the analog voltages correspond to analog data input of each row;
apply a second preset voltage to third wordlines; and
determine a result of the matrix-vector multiplication by voltages of each third bitline.

2. The CiM device according to claim 1 wherein the difference between (i) a voltage between the control end and the second end of said second switch and (ii) a voltage between the control end and the second end of said third switch belonging to the same CiM cell as the second switch, correlates with a stored value of said same CiM cell.

3. The CiM device according to claim 1 wherein said CiM array comprises M rows and N columns, wherein M and N are integers greater than 0, the first wordline, the second wordline, and the third wordline of CiM cells in same row of said CiM array are connected respectively, and/or, the first bitline, the second bitline, and the third bitline of CiM cells in same column of said CiM array are connected respectively.

4. The CiM device according to claim 1 that determines the results of matrix-vector multiplication by voltages of each third bitline, comprising:
   combining states corresponding to the voltages of each third bitline to obtain said result of matrix-vector multiplication.

5. The CiM device according to claim 3 wherein said CiM operations comprise matrix-vector multiplication between an input digital one-dimensional vector and a stored two-dimensional matrix, wherein the two-dimensional matrix is stored in said CiM array, and said control module is used to:
   ground each third bitline for a first duration and then control each third bitline to be floating;
   apply differential voltages to second wordlines and third wordlines of each row, wherein the differential voltages correspond to a digital data input of each row; and
   determine a result of matrix-vector multiplication of voltages of each third bitline.

6. The CiM device according to claim 1 wherein a capacitance of an overlapping capacitor of said second switch and said third switch belonging to the same CiM cell as said second switch is greater than the overlapping capacitor of said first switch and said fourth switch belonging to the same CiM cell as said second switch and said third switch.

7. A chip wherein said chip comprises a Computing-in-Memory (CiM) device comprising:
   a CiM array comprising at least one CiM cell comprising a first switch, a second switch, a third switch, a fourth switch, a coupling capacitor, a first bitline, a second bitline, a third bitline, a first wordline, a second wordline and a third wordline, wherein a first end, a second end and a control end of the first switch are connected to the first bitline, a control end of the second switch and the first wordline respectively, a first end of the second switch is connected to a first end of the third switch and to a first end of the coupling capacitor respectively, a second end of the second switch is connected to the second wordline, a control end and a second end of the third switch are connected to a first end of the fourth switch and the third wordline respectively, a control end and a second end of the fourth switch are connected to the first wordline and to the second bitline respectively, a second end of the coupling capacitor is connected to the third bitline; and
   a control module, connected to said CiM array, controlling voltage states of each wordline and each bitline, whereby data is read and written through said CiM array or CiM operations are performed,
   wherein said CiM array comprises M rows and N columns, wherein M and N are integers greater than 0, the first wordline, the second wordline, and the third wordline of CiM cells in same row of said CiM array are connected respectively, and/or, the first bitline, the second bitline, and the third bitline of CiM cells in same column of said CiM array are connected respectively,
   wherein said CiM operations comprise a matrix-vector multiplication between an input analog one-dimensional vector and a stored two-dimensional matrix, wherein the two-dimensional matrix is stored in said CiM array, said control module is used to:
   ground each third bitline for a first duration and then control each third bitline to be floating;
   apply analog voltages to each second wordline, wherein the analog voltages corresponds to analog data input of each row;
   apply a second preset voltage to third wordlines; and
   determine a result of the matrix-vector multiplication by voltages of each third bitline.

8. An electronic device wherein said electronic device comprises a chip, wherein said chip comprises a Computing-in-Memory (CiM) device comprising:
   a CiM array comprising at least one CiM cell comprising a first switch, a second switch, a third switch, a fourth switch, a coupling capacitor, a first bitline, a second bitline, a third bitline, a first wordline, a second wordline and a third wordline, wherein a first end, a second end and a control end of the first switch are connected to the first bitline, a control end of the second switch and the first wordline respectively, a first end of the second switch is connected to a first end of the third switch and to a first end of the coupling capacitor respectively, a second end of the second switch is connected to the second wordline, a control end and a second end of the third switch are connected to a first end of the fourth switch and the third wordline respectively, a control end and a second end of the fourth switch are connected to the first wordline and to the second bitline respectively, a second end of the coupling capacitor is connected to the third bitline; and
   a control module, connected to said CiM array, controlling voltage states of each wordline and each bitline, whereby data is read and written through said CiM array or CiM operations are performed,
   wherein said CiM array comprises M rows and N columns, wherein M and N are integers greater than 0, the first wordline, the second wordline, and the third wordline of CiM cells in same row of said CiM array are connected respectively, and/or, the first bitline, the second bitline, and the third bitline of CiM cells in same column of said CiM array are connected respectively,
   wherein said CiM operations comprise a matrix-vector multiplication between an input analog one-dimensional vector and a stored two-dimensional matrix, wherein the two-dimensional matrix is stored in said CiM array, said control module is used to:
   ground each third bitline for a first duration and then control each third bitline to be floating;
   apply analog voltages to each second wordline, wherein the analog voltages corresponds to analog data input of each row;
   apply a second preset voltage to third wordlines; and
   determine a result of the matrix-vector multiplication by voltages of each third bitline.

* * * * *

UNITED STATES PATENT AND TRADEMARK OFFICE
CERTIFICATE OF CORRECTION

PATENT NO. : 12,105,986 B2
APPLICATION NO. : 17/740183
DATED : October 1, 2024
INVENTOR(S) : Xueqing Li et al.

Page 1 of 1

It is certified that error appears in the above-identified patent and that said Letters Patent is hereby corrected as shown below:

In the Claims

At Column 20, Line 10, "Computer-in-Memory (CiM)" should be -- Computing-in-Memory (CiM) --.

Signed and Sealed this
Fourth Day of February, 2025

Coke Morgan Stewart
*Acting Director of the United States Patent and Trademark Office*